United States Patent
Nilsson

(10) Patent No.: US 8,610,502 B2
(45) Date of Patent: Dec. 17, 2013

(54) RE-CONFIGURABLE AMPLIFIER

(75) Inventor: Joakim Nilsson, Mölndal (SE)

(73) Assignee: SAAB AB, Linköping (SE)

( * ) Notice: Subject to any disclaimer, the term of this patent is extended or adjusted under 35 U.S.C. 154(b) by 3 days.

(21) Appl. No.: 13/063,799

(22) PCT Filed: Sep. 12, 2008

(86) PCT No.: PCT/SE2008/051026
§ 371 (c)(1),
(2), (4) Date: Mar. 14, 2011

(87) PCT Pub. No.: WO2010/030214
PCT Pub. Date: Mar. 18, 2010

(65) Prior Publication Data
US 2011/0169571 A1     Jul. 14, 2011

(51) Int. Cl.
*H03F 3/60*   (2006.01)

(52) U.S. Cl.
USPC .......................................... 330/286; 330/295

(58) Field of Classification Search
USPC ................................. 330/286, 54, 295, 124 R
See application file for complete search history.

(56) References Cited

U.S. PATENT DOCUMENTS

| | | | |
|---|---|---|---|
| 4,682,176 A | 7/1987 | Jone | |
| 5,070,304 A | 12/1991 | Salib et al. | |
| 5,081,706 A * | 1/1992 | Kim | 455/78 |
| 5,339,041 A | 8/1994 | Nitardy | |
| 6,342,815 B1 * | 1/2002 | Kobayashi | 330/286 |
| 6,657,497 B1 | 12/2003 | Yang et al. | |
| 6,992,543 B2 | 1/2006 | Luetzelschab et al. | |
| 7,492,235 B2 * | 2/2009 | Vice | 333/81 A |
| 7,579,913 B1 * | 8/2009 | Cheng et al. | 330/286 |
| 2007/0176677 A1 | 8/2007 | Apel | |

FOREIGN PATENT DOCUMENTS

JP  2005 069890 A    3/2005

OTHER PUBLICATIONS

PCT/ISA/210—International Search Report—May 15, 2009.
PCT/ISA/237—Written Opinion of the International Searching Authority—May 15, 2009.
PCT/IPEA/409—International Preliminary Report on Patentability—Feb. 8, 2011.
Extended European Search Report, dated May 30, 2012, issued by the European Patent Office in connection with corresponding European Application No. 08813523.1.

* cited by examiner

*Primary Examiner* — Henry Choe
(74) *Attorney, Agent, or Firm* — Venable LLP; Eric J. Franklin

(57) ABSTRACT

An amplifier stage in a radar system including an input matching stage, a transistor stage and an output matching stage. At least one of the matching stages includes a switch. Each switch is arranged to connect or disconnect a corresponding at least one grounded matching component to or from the matching stage. Each switch in the matching stages of the amplifier stage is a switch that is arranged to connect or disconnect grounded matching components to or from the matching stages.

5 Claims, 2 Drawing Sheets

RE-CONFIGURABLE AMPLIFIER

CROSS-REFERENCE TO RELATED APPLICATIONS

This application is the national phase under 35 U.S.C. § 371 of PCT/SE2008/051026 filed 12 Sep. 2008.

TECHNICAL FIELD

The present invention relates to an amplifier stage in a radar system comprising an input matching stage, a transistor stage and an output matching stage. At least one of the matching stages comprises at least two branches, each branch having certain electric properties.

BACKGROUND

Today, a radar system may be multifunctional, for example both comprising functions for traditional narrowband radar tracking and for broadband electronic warfare (EW). Thus both a radar mode and an EW mode is desired.

In the radar mode, a high output power, and a high degree of efficiency is desired.

In the EW mode, disturbing signals are transmitted, and the transmission should have a very broad bandwidth and linear amplification.

For such a radar system, distributed power amplifiers may be used, where the power amplifiers comprise transistors in so-called wide band-gap (WBG) materials such as gallium nitride (GaN). A distributed amplifier is positioned relatively close to the radar system's radiating elements. The power density for GaN transistors of approximately 400 µm is typically about 7-8 W/mm gate-width compared with about 1 W/mm gate-width for the material gallium arsenide (GaAs). Distributed amplifiers demands small transistors in order to obtain sufficient bandwidth, for example 4-18 GHz, but since it is possible to acquire a relatively high output power from a GaN transistor, a sufficient total output power is obtained anyway.

In order to switch between the radar mode and the EW mode, different arrangements are used today. For example, two different amplifiers with corresponding matching networks may be connected to the same radiating element, where a switch, placed between the amplifiers and an output to a radiating element, switches between the different amplifiers.

Another example comprises one amplifier and two parallel matching networks, where a first switch, placed between the amplifier and the two matching networks switches between the different matching networks. A corresponding second switch is placed between the matching networks and an output to a radiating element. The switches are synchronized, either leading the output from the amplifier to one of the two matching networks, and further to the radiating element, or leading the output from the amplifier to the other matching network, and further to the radiating element.

In the second example, there is one amplifier less, but one more switch. For both these prior art examples, there are problems with high switch losses and isolation between the amplifiers and/or matching networks, and such arrangements also becomes quite large, complex and expensive.

It is therefore desirable to obtain a distributed amplifier arrangement in a radar arrangement having a radar mode and an EW mode, where the drawbacks mentioned above are reduced.

SUMMARY

It is an object of the present invention to provide a radar system which comprises a distributed amplifier arrangement, the radar system having a radar mode and an EW mode, where the drawbacks mentioned above are reduced.

Said object is solved by means of a radar arrangement s mentioned initially. Furthermore, the amplifier stage further comprises switching means arranged for switching such that at least one of the branches is electrically connected to the amplifier stage.

Other preferred embodiments are evident from the dependent claims.

BRIEF DESCRIPTION OF THE DRAWINGS

The present invention will now be disclosed more in detail with reference to the appended drawings, where.

DETAILED DESCRIPTION

Figure 1:
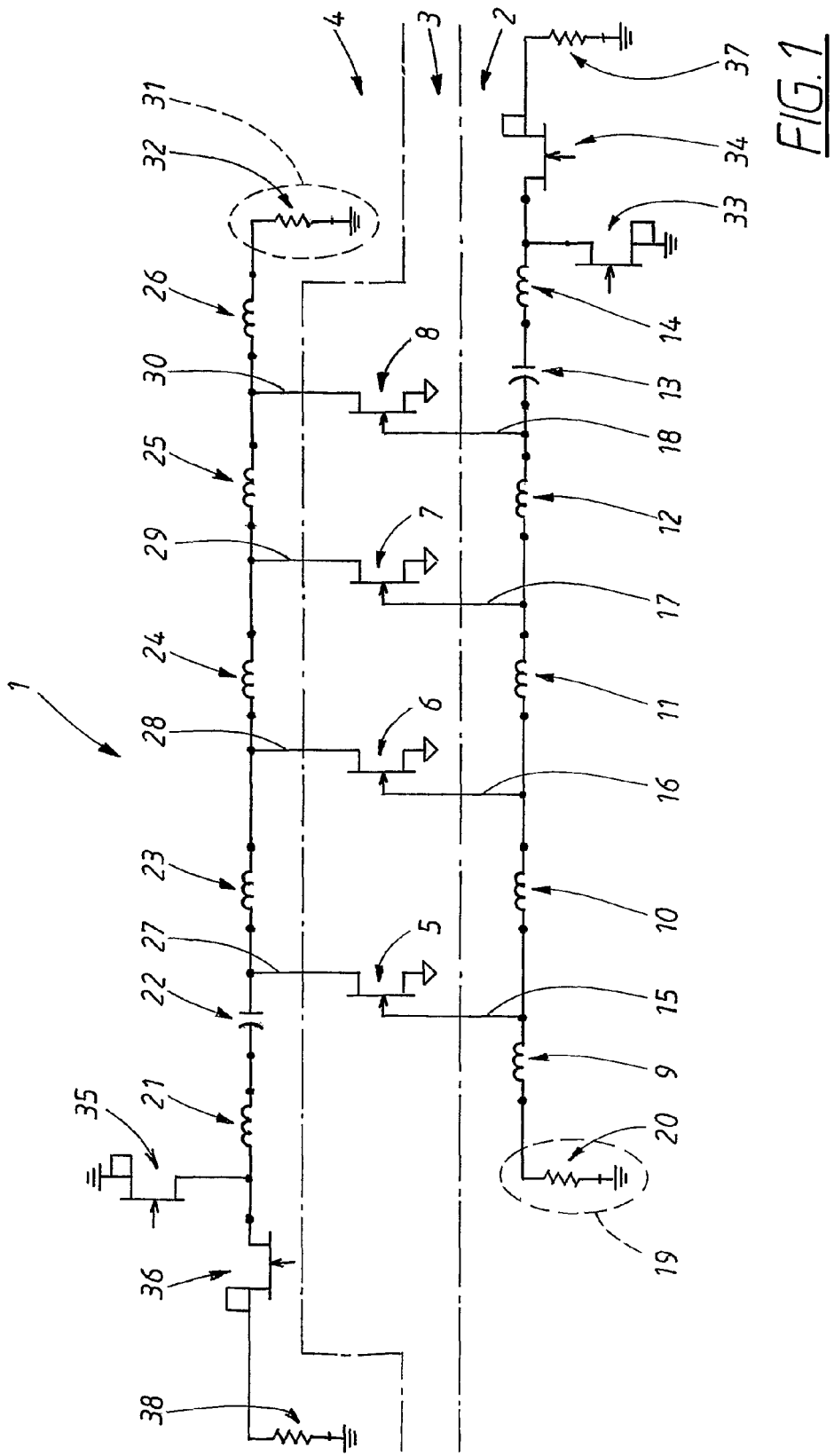
FIG. 1 shows a schematic over a distributed amplifier according to the invention.

With reference to FIG. 1, a distributed amplifier stage 1 in a multifunctional radar system comprises an input matching stage 2, a transistor stage 3 and an output matching stage 4. The transistor stage 3 comprises a first transistor 5, a second transistor 6, a third transistor 7 and a fourth transistor 8, where the transistors 5, 6, 7, 8 are connected in parallel between the input matching stage 2 and the output matching stage 4.

The input matching stage 2 comprises a first inductor 9, a second inductor 10, a third inductor 11, a fourth inductor 12, a first direct current (DC) blocking capacitor 13 and a fifth inductor 14, where said components 9, 10, 11, 12, 13, 14 are coupled in series, one after the other. The inductors 9, 10, 11, 12, 14 are used as matching components.

Between the first inductor 9 and the second inductor 10 there is a connection 15 to the first transistor's 5 gate. Between the second inductor 10 and the third inductor 11 there is a connection 16 to the second transistor's 6 gate. Between the third inductor 11 and the fourth inductor 12 there is a connection 17 to the third transistor's 7 gate. Between the fourth inductor 12 and the first DC blocking capacitor 13 there is a connection 18 to the fourth transistor's 8 gate.

The first inductor 9 is connected to a signal generator 19 which is arranged to deliver an input signal $S_{in}$ to the input matching stage 2, where the signal generator 19 has an inner resistance 20.

The output matching stage 4 comprises a sixth inductor 21, a second DC blocking capacitor 22, a seventh inductor 23, an eighth inductor 24, a ninth inductor 25, and a tenth inductor 26, where said components 21, 22, 23, 24, 25, 26 are coupled in series, one after the other. The inductors 21, 23, 24, 25, 26 are used as matching components.

Between the second DC blocking capacitor 22 and the seventh inductor 23 there is a connection 27 to the first transistor's 5 drain. Between the seventh inductor 23 and the eighth inductor 24 there is a connection 28 to the second transistor's 6 drain. Between the eighth inductor 24 and the ninth inductor 25 there is a connection 29 to the third transistor's 7 drain. Between the ninth inductor 25 and the tenth inductor 26 there is a connection 30 to the fourth transistor's 8 drain.

The tenth inductor 26 is connected to a an output port 31 delivering an output signal $S_{out}$ from the output matching stage 4, where the output port 31 is connected to a radiating element, here shown as a grounded load resistance 32.

According to the present invention, the input matching stage 2 and the output matching stage 4 each comprises two switch transistors 33, 34; 35 36; the input matching stage 2 comprises a first switch transistor 33 and a second switch transistor 34, and the output matching stage 4 comprises a third switch transistor 35 and a fourth switch transistor 36.

At the input matching stage 2, the fifth inductor 14 is connected to the first switch transistor 33 and the second switch transistor 34, which switch transistors 33, 34 are connected in parallel to ground, the second switch transistor 34 via a first termination resistance 37.

At the output matching stage 4, the sixth inductor 21 is connected to the third switch transistor 35 and the fourth switch transistor 36, which switch transistors 35, 36 are connected in parallel to ground, the fourth switch transistor 36 via a second termination resistance 38.

When the second switch transistor 34 and the fourth switch transistor 36 are conducting, and the first switch transistor 33 and the third switch transistor 35 are turned off, the broadband EW mode is turned on.

In order to obtain the narrowband radar mode, the switch transistors 33, 34, 35, 36 are chosen to be turned off or conducting in such a way that the desired electrical properties are obtained. In other words, the radar mode is matched by varying the properties of the switch transistors 33, 34, 35, 36, and in this way the output power may be increased, in an example with approximately 3 dB, compared with the EW mode.

Here, the electric properties of the switch transistors 33, 34, 35, 36 themselves are used as matching features. This is also the case in the next example.

Figure 2:
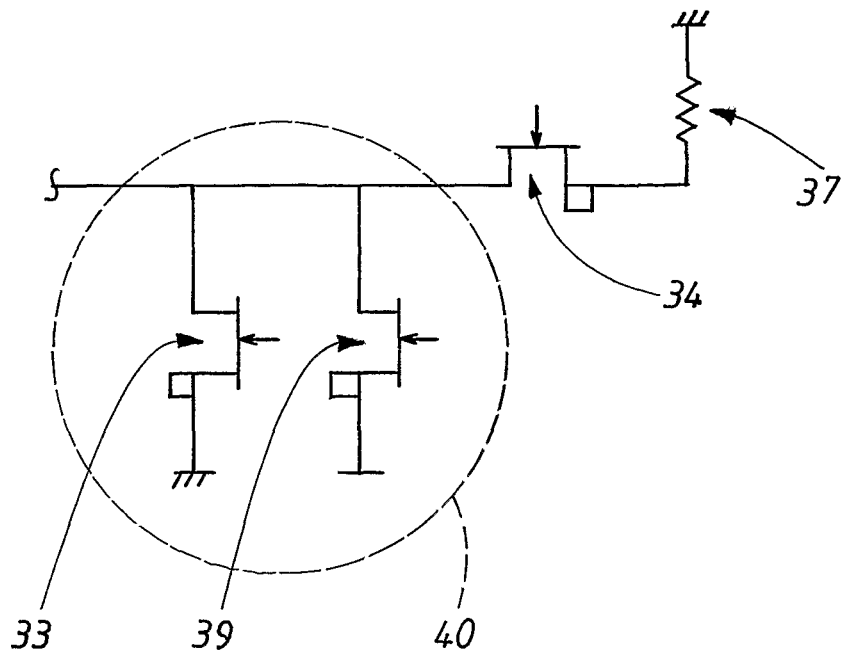
FIG. 2 shows a schematic over a part of a first embodiment alternative of the invention.

With reference to FIG. 2, showing a part of the input matching stage 2, the first and second switch transistors 33, 34 are each connected to ground in the same way as before. However, the first switch transistor 33 is connected in parallel with another switch transistor 39, forming a switch transistor branch 40, such that in this branch 40 either the first switch transistor 33, the other switch transistor 39, both or none is/are connected. The first switch transistor 33 and the other switch transistor 39 preferably have different electrical properties for matching purposes. A corresponding arrangement (not shown) is preferably comprised in the output matching stage 4.

Figure 3:
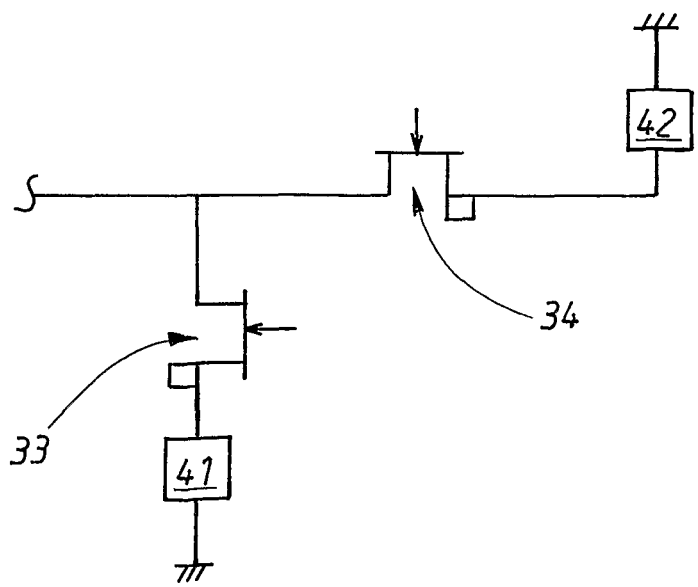
FIG. 3 shows a schematic over a part of a first embodiment alternative of the invention.

The matching may comprise passive components also. With reference to FIG. 3, showing a part of the input matching stage 2, the first and second switch transistor 33, 34 are each connected in series to ground via a corresponding first matching network 41 and second matching network 42. Each matching network 41, 42 may comprise an inductor, a capacitor or combinations of these and/or other components, the combinations comprising parallel and/or serial connections.

The matching components may be in discrete form or in distributed form. Discrete components are mounted components, which normally are mounted to the circuit board copper pattern at certain mounting pads, and distributed components are parts of the circuit board copper pattern, such as stubs.

By means of the switch transistors 33, 34, 35, 36, a re-configurable matching network is obtained, in FIG. 3 the first matching network 41 or the second matching network 42 may be connected via its corresponding transistor 33, 34. Both or none may also be connected, depending on the desired function.

Corresponding matching networks (not shown) are preferably connected to the third and fourth switch transistors 35, 36, in the output matching stage 4. Matching networks may comprise passive components as described above, but may also comprise active components such as switch transistors as described especially with reference to FIG. 2.

The present invention is not limited to the examples discussed above, but may vary freely within the scope of the dependent claims.

It is apparent that switch transistors may be connected to the input and output matching stages at any appropriate points such that only themselves or other connected matching components, active or passive, are connected to, or disconnected from, the input and output matching stages. When designing the distributed amplifier stage, it is possible to choose the appropriate points and appropriate components such that a desired re-configurable distributed amplifier stage is obtained, such that it may be switched between a radar mode and an EW mode and have those desired electrical properties that are connected with each one of these modes.

The amplifier need not be distributed, but may be positioned at any suitable place in the system. The two modes need not be radar mode and EW mode, but any suitable modes in a radar system requiring different electrical properties.

The switches may be of any suitable type, for example PIN diode switches, or any other suitable switching means.

The structure of the stages in the example discussed is in no way limiting; the number of transistors in the transistor stage may vary, and their connections and configurations in the circuit may also vary. The same is the case for the fixed inductors 9, 10, 11, 12, 14; 21, 23, 24, 25, 26 in the input matching stage 2 and the output matching stage 4. Any type of suitable matching components may be used, and their connections and configurations in the circuit may also vary. The number of fixed matching components in relation to the number of transistors in the transistor stage may also vary, it is even conceivable that there are no fixed matching components, only re-configurable matching components according to the present invention.

The invention in its simplest form is constituted by an amplifier stage in a radar system comprising an input matching stage, a transistor stage and an output matching stage. At least one of the matching stages comprises at least two branches, each branch having certain electric properties. The amplifier stage further comprises switching means, for example switch transistors, arranged for switching such that at least one of the branches is electrically connected to the amplifier stage. In this way, at least one of the matching stages is re-configurable, but preferably both matching stages are re-configurable.

In the example discussed with reference to FIG. 1, for example when regarding the input matching stage 2, one branch that always is electrically connected to the matching stage is the one comprising the first to fifth inductor 9, 10, 11, 12, 14, and two more branches may be electrically connected to the matching stage by means of the first switch transistor 33 and second switch transistor 34.

It is also possible that the switching transistors switch between two matching branches in a matching stage, such that either one of two, or more, matching branches is electrically connected to the matching stage for certain modes of operation. If there are several branches, certain combinations of the branches may furthermore be electrically connected to the matching stage in order to obtain a number of corresponding matching configurations.

All transistors are biased according to traditional biasing, for matters of simplicity, no biasing circuits have been shown, but should be easily conceived by a person skilled in the art.

The invention claimed is:

1. An amplifier stage in a radar system, comprising:
an input matching stage comprising at least two switches connected in series to an input transmission line,
a transistor stage, and
an output matching stage comprising at least two switches connected in series with each other to an output transmission line, wherein the switches of the input matching stage and the output matching stage are arranged to connect or disconnect a corresponding at least one grounded matching component to or from said matching stage, wherein the switches of the input matching stage and the output matching stage are arranged to connect or disconnect grounded matching components to or from said matching stages and for switching, such that at least one of the matching stages is electrically connected to the amplifier stage in order to attain a radar mode or a broadband mode, wherein the radar mode is a high output power, and the broadband mode comprises transmitting disturbing signals.

2. The amplifier stage according to claim 1, wherein the switches obtain two different matchings for the amplifier stage.

3. The amplifier stage according to claim 2, wherein said different matchings correspond to different modes of operation.

4. The amplifier stage according to claim 1, wherein the switches comprise switch transistors.

5. The amplifier stage according to claim 1, wherein at least one branch comprises any one of
passive matching elements;
active matching elements; or
a combination of passive matching elements and active matching elements.

* * * * *